(12) United States Patent
Huang et al.

(10) Patent No.: US 6,319,750 B1
(45) Date of Patent: Nov. 20, 2001

(54) LAYOUT METHOD FOR THIN AND FINE BALL GRID ARRAY PACKAGE SUBSTRATE WITH PLATING BUS

(75) Inventors: Chien-Ping Huang, Hsin chu Hsien; Tzong-Da Ho, Taichung, both of (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/711,988

(22) Filed: Nov. 14, 2000

(51) Int. Cl.$^7$ .......................... H01L 21/44; H01L 21/48; H01L 21/50
(52) U.S. Cl. .......................... 438/106; 438/109; 438/113
(58) Field of Search ................................ 438/110, 112, 438/113, 106, 107, 109, 128, 129, 438, 462, 361, 458, 728, 730, 108

(56) References Cited

U.S. PATENT DOCUMENTS 6,218,731 * 8/1999 Huang et al. .......................... 257/738
6,281,047 * 11/2000 Wu et al. .............................. 438/113

\* cited by examiner

Primary Examiner—David Nelms
Assistant Examiner—Thao P Le
(74) Attorney, Agent, or Firm—Peter F. Corless; Edwards & Angell, LLP

(57) ABSTRACT

A layout method is proposed for semiconductor package substrate with plating bus, such as TFBGA (Thin & Fine Ball Grid Array) substrate, which can help allow each singulated package unit from the substrate to be substantially free of trace short-circuits due to misaligned cutting during singulation process. The proposed layout method is characterized in the provision of a plating bus of a special layout pattern for interconnecting all the via lands alongside each singulation line. The plating bus includes a plurality of crosswise segments, each being used to to interconnect one crosswise-opposite pair of the via lands across the singulation line; and a plurality of diagonal segments, each being used to interconnect one neighboring pair of the crosswise segments diagonally to each other across the singulation line. The proposed layout method allows each singulated package unit from the substrate to be substantially free of trace short-circuits due to misaligned cutting during singulation process. Moreover, it also allows the layout design work to be less complex than prior art.

2 Claims, 4 Drawing Sheets

LAYOUT METHOD FOR THIN AND FINE BALL GRID ARRAY PACKAGE SUBSTRATE WITH PLATING BUS

BACKGROUND OF THE INVENTION

1. Field of the Invention

This invention relates to semiconductor packaging technology, and more particularly, to a layout method for a semiconductor package substrate with a plating bus, such as a TFBGA (Thin & Fine Ball Grid Array) substrate, which can help allow each singulated package unit from the TFBGA substrate to be substantially free of trace short-circuits due to misaligned cutting during singulation process.

2. Description of Related Art

BGA (Ball Grid Array) is an advanced type of semiconductor packaging technology which is characterized in the use of a substrate whose front surface is used for the mounting of a semiconductor chip thereon, and whose back surface is used for the mounting of a grid array of solder balls to allow the entire package body to be mechanically bonded and electrically coupled to an external printed circuit board (PCB). This structure allows the BGA package to be made very compact in size.

TFBGA (Thin & Fine Ball Grid Array) is a downsized type of BGA technology that provides semiconductor packages in very small sizes, which are customarily fabricated in batch from a single large-size chip carrier, such as a substrate. The large-size TFBGA substrate is predefined with a matrix of package sites, and an individual TFBGA package unit can be obtained by cutting apart each package site from the TFBGA substrate through singulation process.

In layout design, a TFBGA substrate is typically predefined with a great number of bond pads, electrically-conductive traces, and solder-ball pads, which are separately located at different locations all over the package sites. During the TFBGA fabrication, it is required to plate an electrically-conductive material, such as the alloy of nickel and gold (Mi—Au), onto these traces and pads to make them highly conductive to electricity. To facilitate the plating process, these traces and pads are all connected in layout design to, a provisional plating bus, which is used to conduct electricity to al the traces and pads during plating process, and which can be cut away in the final singulation process.

A conventional layout method for TFBGA substrate with plating bus is depicted in the following with reference to FIGS. 1A–1C.

FIG. 1A shows a schematic plan view of the front surface of a TFBGA substrate 100 utilizing a conventional layout method (note that FIG. 1A is simplified to show only a small number of electrically-conductive trades and via lands for demonstrative purpose; the actual layout may be much more complex).

As shown, this TFBGA substrate 100 is predefined into a plurality of package sites (only two are shown in FIG. 1A, respectively designated by the reference numerals 110a, 110b) which are delimited by a plurality of crosswise and lengthwise singulation lines $SL_X$, $SL_Y$. In the final singulation process, the respective package sites 110a, 110b can be cut apart into individual package units along these predefined singulation lines $SL_X$, $SL_Y$.

These package sites 110a, 110b are predefined with the sane circuit layout, wherein the package site 110a is predefined with at least one die-mounting area 111a which is associated with a plurality of crosswise-extending electrically-conductive traces 112a and two rows of via lands 113a located on both sides of the die-mounting area 111a and alongside the nearby lengthwise singulation lines $SL_Y$, and similarly, the neighboring package site 110b is predefined with at least one die-mounting area 111b which is associated with a plurality of crosswise-extending electrically-conductive traces 112b and two rows of via lands 113b located on both sides of the die-mounting area 111b and alongside the nearby lengthwise singulation lines $SL_Y$.

The via lands 113a, 113b define the locations where electrically-conductive vias (not shown) are formed to interconnect the electrically-conductive traces 112a, 112b on the front surface of the TFBGA substrate 100 with the solder-ball pads (not shown) on the back surface of the same. Since the fabrication of these vias (not shown) and solder-ball pads (not shown) is not within the spirit and scope of the invention, description thereof will not be further detailed.

During the TFBGA fabrication, it is required to perform plating on the bonding finger area 111a, 111b electrically-conductive traces 112a, 112b on the front surface and the solder-ball pads (not shown) on the back surface. To facilitate the plating process, the via lands 113a, 113b are all connected to a common plating bus 120, so that the electricity used during the plating process can be applied to the plating bus 120 and then concurrently distributed by the plating bus 120 by way of the via lands 113a, 113b and the electrically-conductive traces 112a, 112b to the bonding finger area 111a, 111b on the front surface and the solder-ball pads (not shown) on the back surface of the TFBGA substrate 100.

In layout design, the plating bus 120 is formed in a grid shape and laid directly over the crosswise and lengthwise singulation lines $SL_X$, $SL_Y$, so that in the final singulation process, the plating bus 120 can be entirely cut away.

One drawback to the forgoing layout method, however, is that, since the TFBGA substrate 100 is typically very small in size, where the plating bus 120 is typically from 0.05 mm to 0.1 mm (millimeter) in width and the cutting blade (not shown) used in the singulation process is typically 0.3 mm in width, the alignment of the cutting blade (not shown) to the singulation lines $SL_X$, $SL_Y$ should be highly precisely controlled; otherwise, in the case that the misalignment exceeds 0.115 m, it would cause the problem of trace short-circuits.

As shown in FIG. 1B, when the cutting blade's position (designated by CB) is misaligned to the singulation line $SL_Y$, then it would be likely to leave an edge part of the plating bus 120 beyond the cutting range.

As shown in FIG. 1C, in the case of an overly misaligned cutting during singulation process, a small edge part of the original plating bus (designated here by the reference numeral 121) might be left over the edge of the singulated package site 110a, which would cause the electrically-conductive traces 112a on the package site 110a to be short-circuited to each other. When this is the case, the singulated TFBGA package unit would be regarded as defective.

FIG. 2 shows a solution to the foregoing problem of trace short-circuits due to misaligned cutting during singulation process.

As shown, this improved layout method is utilized on a TFBGA substrate 200 predefined into a plurality of package sites (only two are shown in FIG. 2, respectively designated by the reference numerals 210a, 210b which are delimited by a plurality of crosswise and lengthwise singulation lines $SL_X$, $SL_Y$.

The package site 210a is predefined with at least one die-mounting area 211a which is associated with a plurality of crosswise-extending electrically-conductive traces 212a and two rows of via lands 213a located on both sides of the die-mounting area 211a and alongside the nearby lengthwise singulation lines $SL_Y$. In largely the same manner, the neighboring package site 210b is also predefined with at least one die-mounting area 211b which is associated with a plurality of electrically-conductive traces 212b and two rows of via lands 213b located on both sides of the die-mounting area 211b and alongside the nearby lengthwise singulation lines $SL_Y$. However, in order to facilitate this improved layout method, it is to be noted that the right row of via lands 213a within the first package site 210a are unaligned in line to the left row of via lands 213b within the second package sites 210b.

This improved layout method is characterized in that all of the via lands 213a, 213b that are laid on both sides of each lengthwise singulation line $ST_Y$ are all connected to a zigzag plating bus 220 extending in a zigzag manner along the lengthwise singulation line $SL_Y$.

It can be easily seen from the illustration of FIG. 2 that even though there is misaligned cutting to the lengthwise singulation line $SL_Y$, the unremoved part of the plating bus 120 would not cause the electrically-conductive traces 212a within the first package site 210a and the electrically-conductive traces 212b within the second package sites 210b to be short-circuited to each other. Therefore, the layout method shown in FIG. 2 can help eliminate the problem of trace short-circuits due to misaligned cutting during singulation process.

One drawback to the foregoing layout method shown in FIG. 2, however, is that it requires the electrically-conductive traces 212a within the first package site 210a to be unaligned in line to the electrically-conductive traces 211b within the second package sites 210b so as to facilitate the zigzag design for the plating bus 220. This unaligned layout pattern, however, would make the overall layout work highly complex and thus difficult to carry out.

SUMMARY OF THE INVENTION

It is therefore an objective of this invention to provide a layout method for a semiconductor package substrate with plating bus, which can help prevent the problem of trace short-circuits due to misaligned cutting during singulation process.

It is another objective of this invention to provide a layout method for a semiconductor package substrate with plating bus, which allows the overall layout work to be easier to implement than the prior art.

In accordance with the foregoing and other objectives, the invention proposes a new layout method for semiconductor package substrate with plating bus. The layout method of the invention comprises the following steps: (1) defining a plurality of package sites on the substrate, each neighboring pair of package sites being delimited by a singulation line; (2) defining at least one die-mounting area within each of the package sites; (3) within each package site, defining at least one row of via lands alongside the singulation line, with the opposite row of via lands within the neighboring package site across the singulation line being substantially aligned crosswise in line; (4) interconnecting all the via lands alongside the singulation line to a common plating bus, which includes: (i) a plurality of crosswise segments, each of which serves to interconnect one crosswise-opposite pair of the via lands across the singulation line; and (ii) a plurality of diagonal segments, each of which serves to interconnect one neighboring pair of the crosswise segments diagonally to each other across the singulation line.

The foregoing layout method allows each singulated package unit from the TFBGA substrate to be substantially free of trace short-circuits due to misaligned cutting during singulation process. Moreover, since the layout method of the invention allows all the electrically-conductive traces to be aligned in line and parallel, it can make the design work easier to carry out than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The layout method according to the invention is disclosed by example of a TFBGA substrate in full details in the following with reference to FIG. 3.

Figure 3:
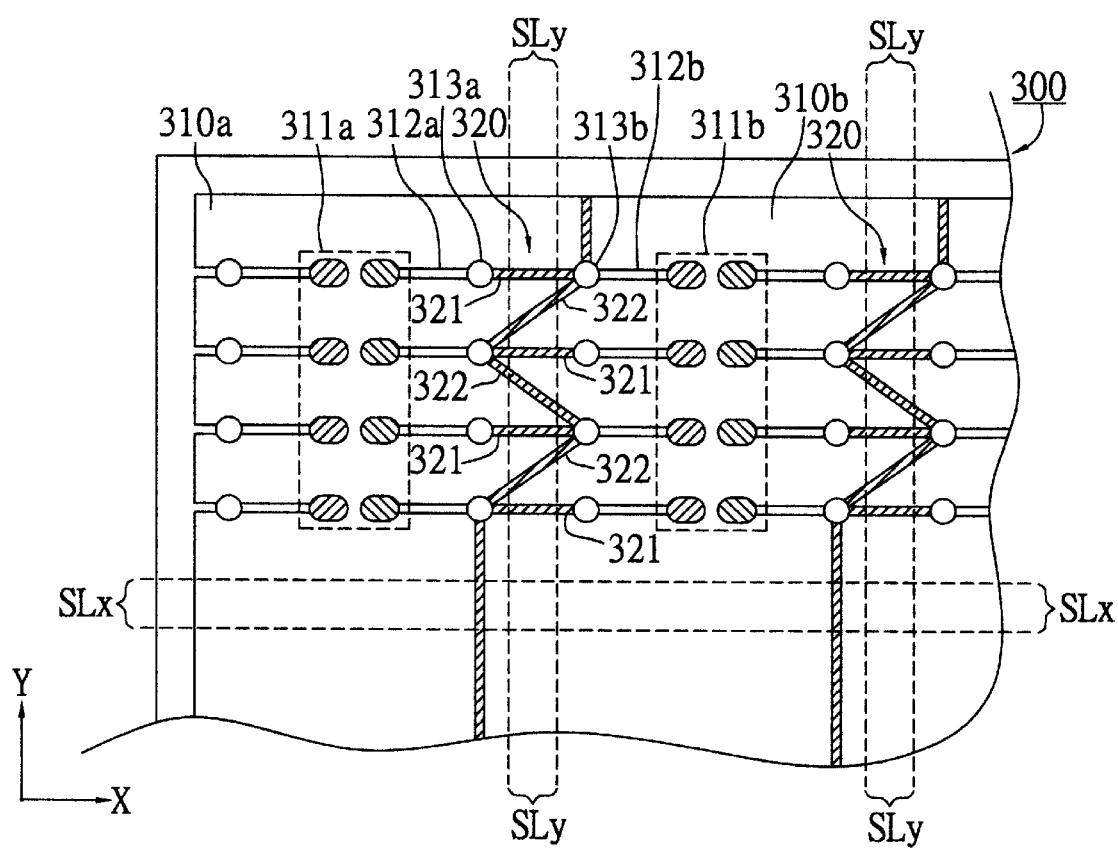
FIG. 3 is a schematic plan view of a TFBGA substrate utilizing the layout method according to the invention.

As shown, the layout method of the invention is utilized on a TFBGA substrate 300 predefined into a plurality of package sites (only two are shown in FIG. 3, respectively designated by the reference numerals 310a, 310b) which are delimited by a plurality of crosswise and lengthwise singulation lines $SL_X$, $SL_Y$. In the final singulation process, the respective, package sites 310a, 310b can be cut apart into individual package units along these predefined singulation lines $SL_X$, $SL_Y$.

These package sites 310a, 310b are predefined with the same circuit layout, wherein the first package site 310a is predefined with at least one die-mounting area 311a which is associated with a plurality of crosswise-extending electrically-conductive traces 312a and two rows of via lands 313a located on both sides of the die-mounting area 311a and alongside the lengthwise singulation lines $SL_Y$; and similarly, the second package site 310b is defined with at least one die-mounting area 311b which is associated with a plurality of crosswise-extending electrically-conductive traces 312b and two rows of via lands 313b located on both sides of the die-mounting area 311b and alongside the lengthwise singulation lines $SL_Y$ (note that FIG. 3 is simplified to show only a small number of electrically-conductive traces and via lands for demonstrative purpose, the actual layout may be much more complex).

Figure 1A:
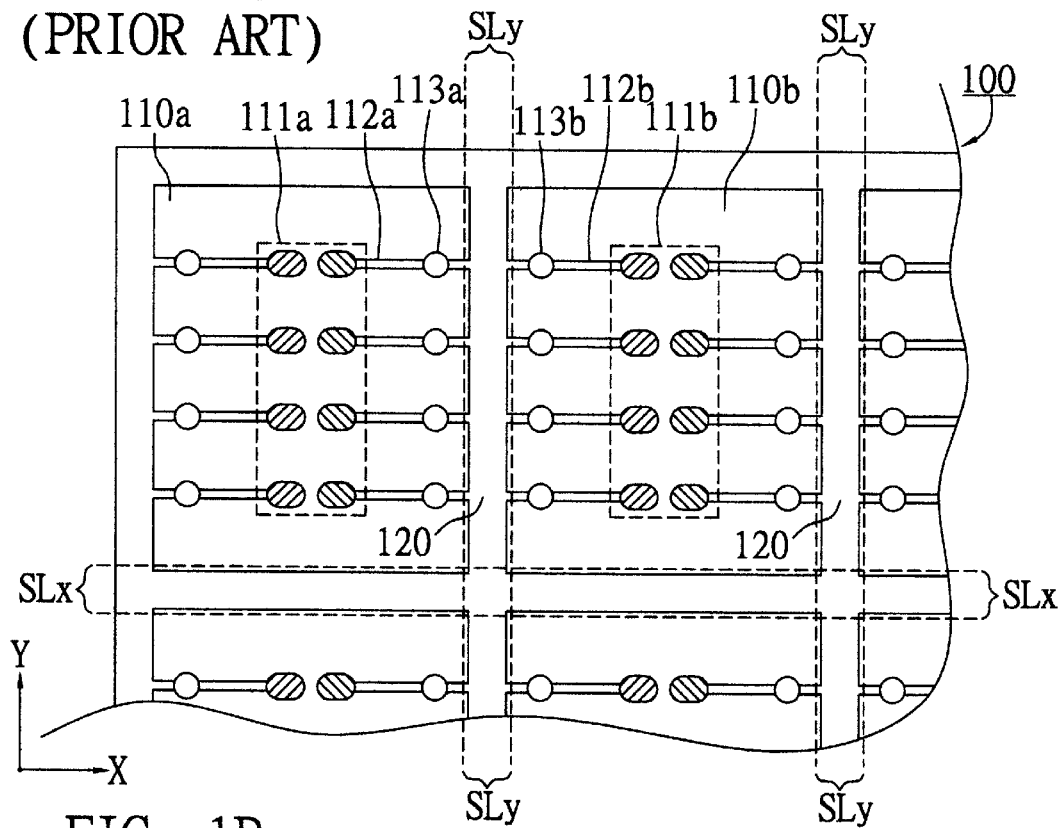
FIG. 1A (PRIOR ART) shows a schematic plan view of a TFBGA substrate utilizing a first conventional layout method.
Figure 1B:
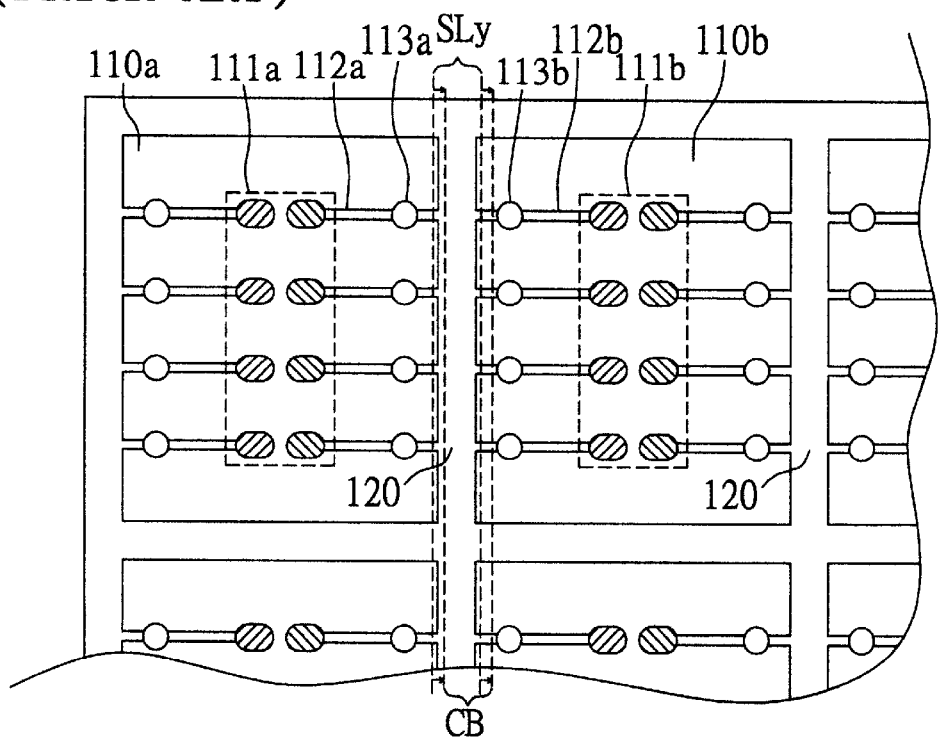
FIG. 1B (PRIOR ART) shows the case of a misaligned cutting during singulation process on the TFBGA substrate of FIG. 1A.
Figure 1C:
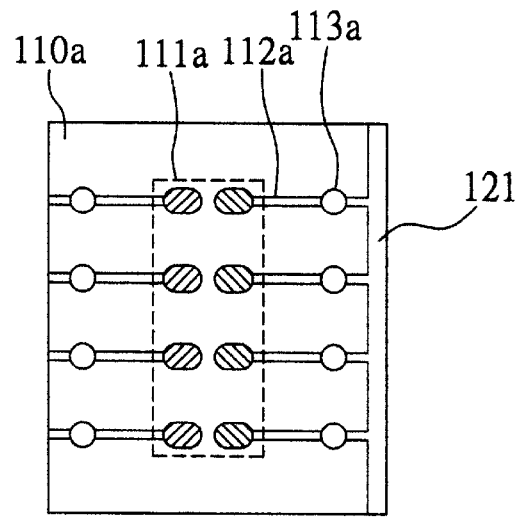
FIG. 1C (PRIOR ART) shows a singulated package unit from the TFBGA substrate of FIG. 1A in the case of misaligned cutting during singulation process.
Figure 2A:
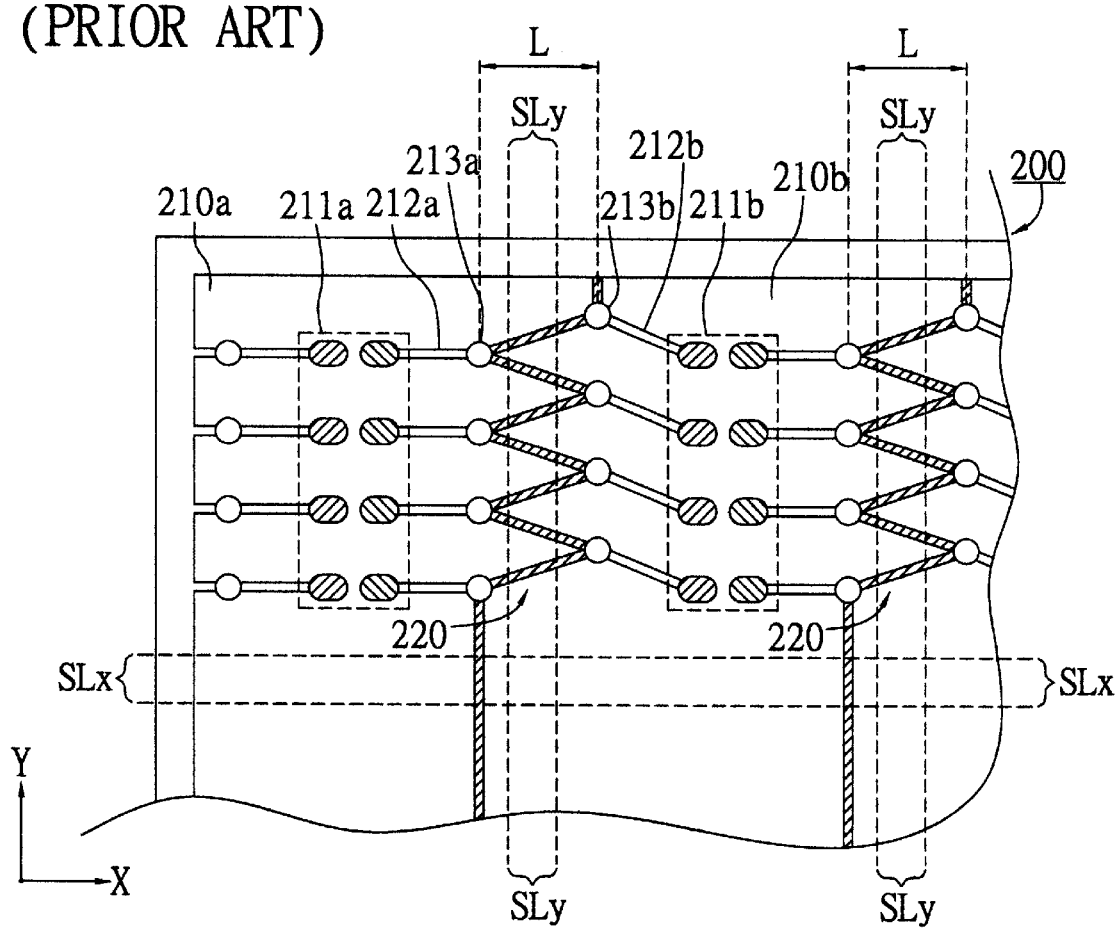
FIG. 2 (which includes FIGS. 2A and 2B) (PRIOR ART) is a schematic plan views of a TFBGA substrate utilizing a second conventional layout method.
Figure 2B:
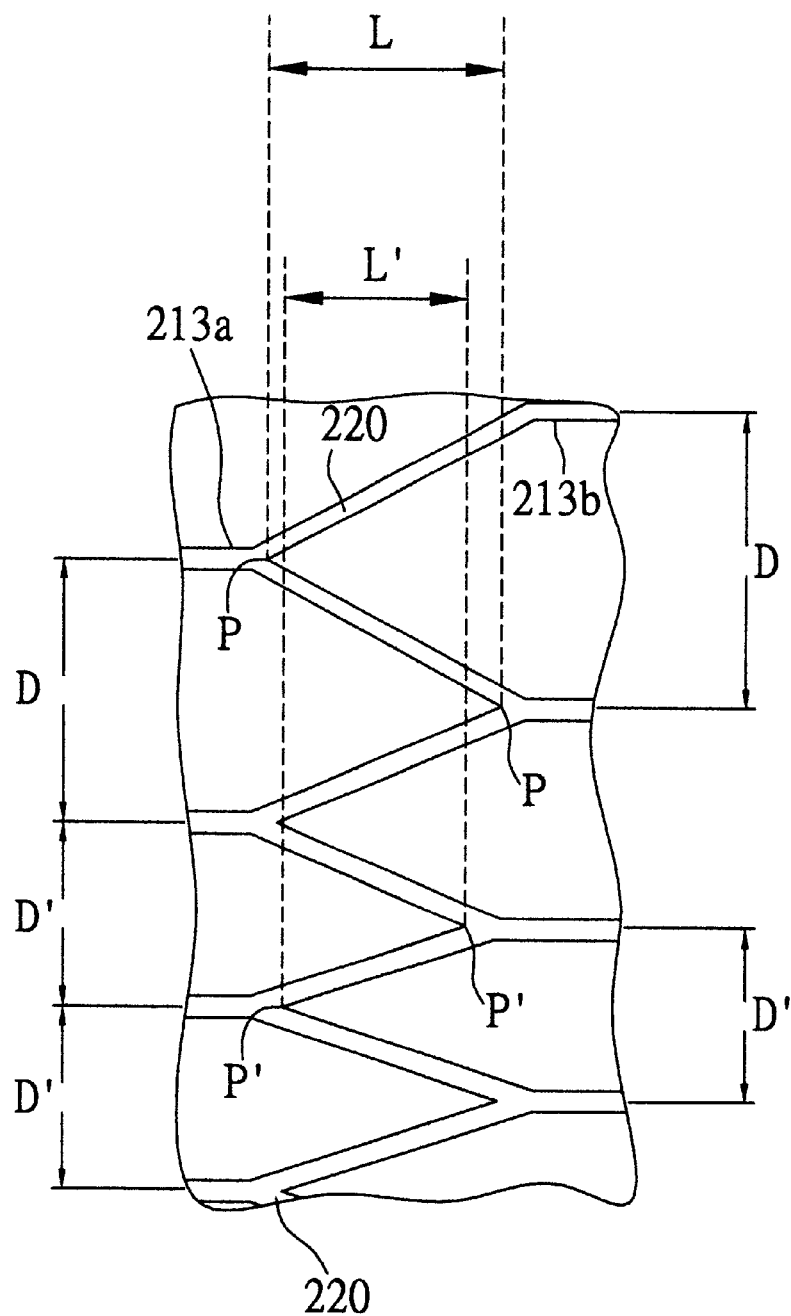

It is to be noted that, by the layout method of the invention, all of the electrically-conductive traces 312a, 312b and the via lands 313a, 313b within the respective package sites 310a, 310b can be aligned in line and parallel to each other, so that it would make the design work easier to carry out than the prior art of FIG. 2.

It is a characteristic feature of the invention that all of the via lands 313a, 313b on both sides of each lengthwise singulation line $SL_Y$ are interconnected together to an integrally-connected plating bus 320 which is composed of a plurality of crosswise segments 321 and a plurality of diagonal segments 322.

The crosswise segments 321 are each used to interconnect one of the via lands 313a within the first package site 310a with the crosswise-opposite one of the via lands 313b within the second package site 310b across the singulation line $SL_Y$.

The diagonal segments 322 are each used to interconnect each neighboring pair of the crosswise-segments 321 diagonally across the singulation line $SL_Y$ to each other, and all of which are adjoined into a chained zigzag-like line extending along the singulation line $SL_Y$ in an interleaved manner.

The combined pattern of all the crosswise segments 321 and the diagonal segments 322 serves as an integrally-connected electrically-conductive path (i.e., the plating bus 320) connected to all of the via lands 313a, 313b alongside the singulation line $SL_Y$, which allows the electricity used in plating process to be distributed simultaneously to these via lands 313a, 313b and subsequently distributed through these via lands 313a, 313b and both the electrically-conductive traces 312a, 312b to the bonding finger area 311a, 311b on the front surface of the TFBGA substrate 300 and the solder-ball pads (not shown) on the back surface of the same.

It can be seen from the illustration of FIG. 3 that, with the characterized shape of the plating bus 320 provided by the layout method of the invention, all the crosswise segments 321 and the diagonal segments 322 in the plating bus 320 can be broken apart during singulation process, so that even through any part of the plating bus 320 is unremoved by the singulation process due to misaligned cutting, it would not cause the electrically-conductive traces 312a, 312b on both sides of the singulation line $SL_Y$ to be short-circuited to each other.

In conclusion, the invention provides it new layout method for semiconductor package substrate with plating bus, such as a TFBGA substrate, which allows each singulated package unit from the TFBGA substrate to be substantially free of trace short-circuits due to misaligned cutting during singulation process. Moreover, since the layout method of the invention allows all the electrically-conductive traces to be aligned in line and parallel, it allows the design work to be easier to carry out than the prior art. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A layout method for a semiconductor package substrate, comprising:
   (1) defining a plurality of package sites on the substrate, each neighboring pair of package sites being delimited by a singulation line;
   (2) defining at least one die-mounting area within each of the package sites;
   (3) within each package site, defining at least one row of via lands alongside the singulation line, with the opposite row of via lands within the neighboring package site across the singulation line being substantially aligned crosswise in line;
   (4) interconnecting all the via lands alongside the singulation line to a common plating bus, which includes:
      (i) a plurality of crosswise segments, each of which serves to interconnect one crosswise-opposite pair of the via lands across the singulation line; and
      (ii) a plurality of diagonal segments, each of which serves to interconnect one neighboring pair of the crosswise segments diagonally to each other across the singulation line.

2. The method of claim 1, wherein the semiconductor package substrate is a TFBGA substrate.

* * * * *